United States Patent
Kojima

(10) Patent No.: US 9,318,353 B2
(45) Date of Patent: Apr. 19, 2016

(54) METHOD OF MANUFACTURING CONNECTION STRUCTURE

(75) Inventor: Ryoji Kojima, Tochigi (JP)

(73) Assignee: DEXERIALS CORPORATION, Tokyo (JP)

(*) Notice: Subject to any disclaimer, the term of this patent is extended or adjusted under 35 U.S.C. 154(b) by 239 days.

(21) Appl. No.: 14/112,277

(22) PCT Filed: Apr. 2, 2012

(86) PCT No.: PCT/JP2012/058889
§ 371 (c)(1),
(2), (4) Date: Oct. 17, 2013

(87) PCT Pub. No.: WO2012/147458
PCT Pub. Date: Nov. 1, 2012

(65) Prior Publication Data
US 2014/0226297 A1    Aug. 14, 2014

(30) Foreign Application Priority Data
Apr. 27, 2011  (JP) ................................. 2011-098967

(51) Int. Cl.
*H01L 21/50* (2006.01)
*H01L 23/00* (2006.01)
(Continued)

(52) U.S. Cl.
CPC ............... *H01L 21/50* (2013.01); *C09J 7/0203* (2013.01); *H01L 24/27* (2013.01); *H01L 24/75* (2013.01);
(Continued)

(58) Field of Classification Search
CPC ......... H05K 3/30; H05K 3/303; H05K 3/305; H05K 3/341; H05K 3/3431; H05K 1/181; C09J 7/0203; H01L 21/50; H01L 24/16; H01L 24/27; H01L 24/29; H01L 24/32; H01L 24/75; H01L 24/81; H01L 24/83; H01L 24/97; H01L 24/13; H01L 24/73; H01L 25/0652; H01L 15/50; H01L 2021/60; H01L 2224/131; H01L 2224/13124; H01L 2224/13144; H01L 2224/16225; H01L 2224/16227; H01L 2224/32225; H01L 2224/73204; H01L 2224/75316; H01L 2224/75317; H01L 2224/7598; H01L 2224/81193; H01L 2224/83192; H01L 2224/83851; H01L 2224/2225; H01L 2224/83852; H01L 2224/95001; H01L 2224/97; H01L 2225/06517; H01L 2225/06572; H01L 2924/01012; H01L 2924/01029; H01L 2924/07802; H01L 2924/07811; H01L 2924/16787; H01L 2924/15788

See application file for complete search history.

(56) References Cited

U.S. PATENT DOCUMENTS 4,139,881 A * 2/1979 Shimizu et al. ............... 361/760
4,489,487 A * 12/1984 Bura .............................. 29/840
(Continued)

FOREIGN PATENT DOCUMENTS

JP     A-2000-3922       1/2000
JP     A-2001-326322    11/2001
(Continued)

OTHER PUBLICATIONS

International Search Report issued in International Patent Application No. PCT/JP2012/058889 dated Jul. 3, 2012 (w/translation).

*Primary Examiner* — Carl Arbes
(74) *Attorney, Agent, or Firm* — Oliff PLC

(57) ABSTRACT

A method of manufacturing a connection structure which includes a wiring substrate, a first electronic component that is flip-chip mounted on the front surface thereof, and a second electronic component that is flip-chip mounted on the rear surface. The method includes the steps of: temporarily mounting the first electronic component on the front surface of the wiring substrate with a first adhesive film disposed therebetween; temporarily mounting the second electronic component on the rear surface of the wiring substrate with a second adhesive film disposed therebetween, placing, on a pressure bonding receiving base, the wiring substrate on which the first electronic component and the second electronic component are temporarily mounted; and mounting the first electronic component and the second electronic component at a time onto the respective front and rear surfaces of the wiring substrate.

9 Claims, 4 Drawing Sheets

(51) Int. Cl.
*H01L 25/065* (2006.01)
*H01L 25/00* (2006.01)
*H05K 1/18* (2006.01)
*C09J 7/02* (2006.01)
*H01L 21/60* (2006.01)

(52) U.S. Cl.
CPC ............ H01L 24/97 (2013.01); H01L 25/0652 (2013.01); H01L 25/50 (2013.01); H05K 1/181 (2013.01); *H01L 24/13* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 2021/60* (2013.01); *H01L 2224/131* (2013.01); *H01L 2224/13124* (2013.01); *H01L 2224/13144* (2013.01); *H01L 2224/16145* (2013.01); *H01L 2224/16225* (2013.01); *H01L 2224/16227* (2013.01); *H01L 2224/32225* (2013.01); *H01L 2224/73204* (2013.01); *H01L 2224/7598* (2013.01); *H01L 2224/75315* (2013.01); *H01L 2224/75317* (2013.01); *H01L 2224/81193* (2013.01); *H01L 2224/83192* (2013.01); *H01L 2224/83851* (2013.01); *H01L 2224/83862* (2013.01); *H01L 2224/95001* (2013.01); *H01L 2224/97* (2013.01); *H01L 2225/06517* (2013.01); *H01L 2225/06572* (2013.01); *H01L 2924/00011* (2013.01); *H01L 2924/01012* (2013.01); *H01L 2924/01029* (2013.01); *H01L 2924/07802* (2013.01); *H01L 2924/07811* (2013.01); *H01L 2924/15787* (2013.01); *H01L 2924/15788* (2013.01)

(56) References Cited

U.S. PATENT DOCUMENTS

| | | | | |
|---|---|---|---|---|
| 4,761,881 | A | * | 8/1988 | Bora et al. ................. 29/840 |
| 5,155,904 | A | * | 10/1992 | Majd ............................ 29/837 |
| 5,678,304 | A | * | 10/1997 | Soper ........................... 29/840 |
| 6,200,830 | B1 | | 3/2001 | Ito et al. |

FOREIGN PATENT DOCUMENTS

| | | |
|---|---|---|
| JP | A-2006-229106 | 8/2006 |
| JP | A-2007-227622 | 9/2007 |

* cited by examiner

METHOD OF MANUFACTURING CONNECTION STRUCTURE

TECHNICAL FIELD

The present invention relates to a method of manufacturing a double-sided flip-chip mounted type connection structure which includes a wiring substrate, a first electronic component that is flip-chip mounted on the front surface thereof, and a second electronic component that is flip-chip mounted on the rear surface.

BACKGROUND ART

Double-sided flip-chip mounted connection structures are known in which IC chips (Integrated Circuit Chips) are flip-chip mounted onto the respective front and rear surfaces of a wiring substrate with an anisotropic conductive adhesive film (ACF) or a non-conductive adhesive film (NCF) interposed therebetween. Such a double-sided mounted type connection structure is made in a manner such that the ACF or NCF is temporarily affixed onto one surface of the wiring substrate; an IC chip is aligned and temporarily mounted thereon and then subjected to thermal pressure bonding for flip-chip mounting with a heating and pressing tool; and then, another IC chip is flip-chip mounted onto the other surface in the same manner.

However, there arose a problem that the first flip-chip mounting on the one surface caused warpage not only on the wiring substrate but also on the IC chip itself; the another IC chip was aligned with reduced accuracy when the another IC chip was flip-chip mounted onto the other surface; and the IC chips were difficult to be accurately subjected to thermal pressure bonding with the heating and pressing tool. This problem has become noticeable as the IC chip and the wiring substrate have been increasingly reduced in thickness in recent years.

It has been thus practiced to flip-chip mount the IC chips not on one surface and then the other surface in sequence but on both the surfaces at a time. That is, it has been suggested that the thermosetting anisotropic conductive adhesive film (ACF) or non-conductive adhesive film (NCF) is temporarily affixed onto each of the front and rear surfaces of the wiring substrate, and then the IC chips are each temporarily mounted thereon to prepare a half-finished connection structure; the half-finished connection structure is subsequently placed on a placement receiving base which has a placement surface made of a rubber material or the like and which has heating means; and then while the half-finished product is being heated from the side of the placement receiving base, the IC chips on the front surface are pressed with a pressure applying tool having an elastic pressing surface (Patent Literature 1).

CITATION LIST

Patent Literature

Patent Literature 1: JP2007-227622 A1

SUMMARY OF INVENTION

Technical Problem

However, there was a problem with Patent Literature 1 that heating the ACF or NCF placed on the side of the placement receiving base so as to be optimally hardened in order to provide good connection for the ACF or NCF placed on the side of the placement receiving base would cause the ACF or NCF placed on the side of the pressure applying tool to be insufficiently heated and thus not sufficiently hardened, thereby leading to lack of connection reliability. On the other hand, heating the ACF or NCF placed on the side of the pressure applying tool so as to be optimally hardened in order to provide good connection for the ACF or NCF placed on the side of the pressure applying tool would cause, this time, the ACF or NCF placed on the placement receiving base to be excessively heated. This would lead to a quick increase in the melting viscosity causing an adhesive component to be hardened without being sufficiently removed from between the IC chip and the wiring substrate. Thus, this raised a problem or lack of connection reliability.

It is an object of the present invention to solve the conventional technical problems mentioned above. Further, it is an object of the present invention to enable a connection structure, which includes a wiring substrate, a first electronic component flip-chip mounted on the front surface thereof with an ACF or NCF disposed therebetween, and a second electronic component flip-chip mounted on the rear surface, to be fabricated by allowing the ACF or NCF on both the surfaces to be hardened under respectively optimum hardening conditions.

Solution to Problem

The inventor has paid attention to the fact that when electronic components were temporarily mounted onto both the surfaces of a wiring substrate with adhesive films disposed respectively therebetween and then the electronic components placed on both the surfaces were flip-chip mounted thereto by heating the same from one of the surfaces, the adhesive film disposed on the front surface of the wiring substrate to be heated is heated to a higher temperature than that of the adhesive film disposed on the rear surface of the wiring substrate. Then, the inventor has found that the aforementioned object could be achieved by employing two types of adhesive films having different curing temperatures so as to dispose the adhesive film having a higher curing temperature on the front surface of the wiring substrate to be heated. This finding leads the inventor to the completion of the present invention.

That is, the present invention provides a method of manufacturing a connection structure, the connection structure including a wiring substrate, a first electronic component flip-chip mounted on a front surface thereof, and a second electronic component flip-chip mounted on a rear surface, the method including the following steps (a) to (d):

Step (a)
a step of temporarily mounting the first electronic component on the front surface of the wiring substrate with a first adhesive film disposed therebetween;

Step (b)
a step of temporarily mounting the second electronic component on the rear surface of the wiring substrate with a second adhesive film disposed therebetween, the second adhesive film having a curing temperature lower than the curing temperature of the first adhesive film;

Step (c)
a step of placing, on a pressure bonding receiving base, the wiring substrate on which the first electronic component and the second electronic component are temporarily mounted; and Step (d)
a step of heating the first electronic component while pressing the same against the wiring substrate with a heating and pressing tool from the side of the first electronic component, thereby mounting at a time the first electronic component and the second electronic component onto the respective front and rear surfaces of the wiring substrate. In addition, the present invention provides a connection structure manufactured by the manufacturing method.

Advantageous Effects of Invention

In the manufacturing method according to the present invention, the adhesive film disposed on the front surface of the wiring substrate to be heated is heated to a temperature higher than that of the adhesive film disposed on the rear surface of the wiring substrate. Thus, two types of adhesive films having different curing temperatures are employed so as to dispose the adhesive film having the higher curing temperature on the front surface of the wiring substrate on the side thereof to be heated. This enables the adhesive films on both the surfaces of the wiring substrate to be heated at a time to the respectively optimum curing temperatures. It is thus possible to provide the double-sided flip-chip mounted wiring substrate for electronic components with improved connection reliability without causing any warpage on the wiring substrate and the IC chips.

DESCRIPTION OF EMBODIMENTS

Figure 1:
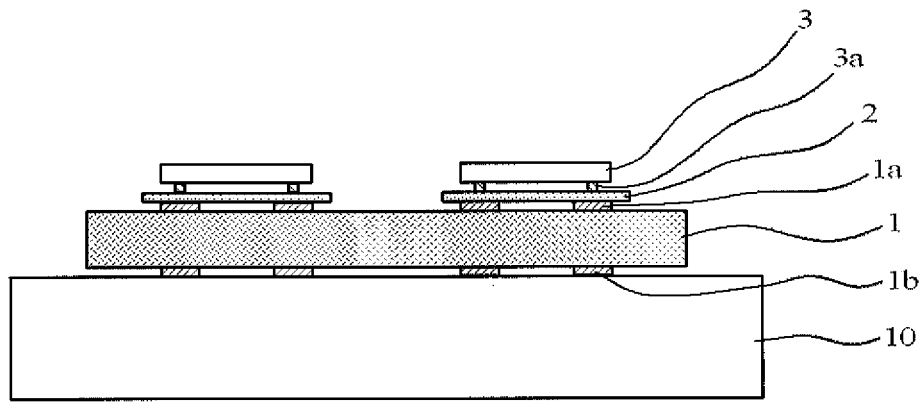
FIG. 1 is an explanatory view of a manufacturing method according to the present invention.

The present invention is a method of manufacturing a connection structure which includes a wiring substrate, a first electronic component that is flip-chip mounted on the front surface thereof, and a second electronic component that is flip-chip mounted on the rear surface. The method has the following Steps (a) to (d). Now, a description will be made to each of the steps in detail with reference to the drawings.
<Step (a)>
First, as shown in FIG. 1, a first electronic component 3 is temporarily mounted on the front surface of a wiring substrate 1 with a first adhesive film 2 disposed therebetween. More specifically, the wiring substrate 1 having a front surface electrode 1a and a rear surface electrode 1b is placed on a stage 10; the first adhesive film 2 is aligned and temporarily affixed onto the front surface electrode 1a; and then the first electronic component 3 having bumps 3a is aligned and temporarily mounted thereon.

As the stage 10, it is possible to employ a flat surface plate which is made of metal, ceramic, or resin and which includes a vacuum chuck mechanism for holding the wiring substrate 1 in place.

The wiring substrate 1 may be one with the front surface electrode 1a and the rear surface electrode 1b, which are each made up of conductor traces or pads such as of copper, aluminum, silver, or gold and which are formed on both the surfaces of a substrate, for example, a glass substrate, a ceramic substrate, a polyimide flexible substrate, or a glass epoxy substrate. These electrodes can be subjected, as required, for example, to electroplating, electroless nickel plating, solder plating, or gold plating.

As the first adhesive film 2, it is possible to employ a well-known ACF or NCF. The film that can be employed may be made of a paint for forming the first adhesive film with the help of a well-known technique such as by casting. The first adhesive film forming paint may contain, for example, a liquid-state or solid-state epoxy-based resin as a hardening component; a phenoxy resin as a film forming component; an acid anhydride or an imidazole as a hardening agent for epoxy-based resin; and other well-known additives such as a silane coupling agent, a pigment, an antioxidant, a diluent, a solvent, and an anti-static agent added to such an extent that the effects of the present invention are not impaired.

As the first electronic component 3, it is possible to preferably employ an IC chip or optical chip. As the bumps 3a, it is possible to employ a solder bump, a gold bump, or an aluminum bump. In particular, an Au stud bump is preferable. The bumps other than the gold bump can be subjected to electroplating, electroless nickel plating, solder plating, or gold plating, as required.

Figure 2:
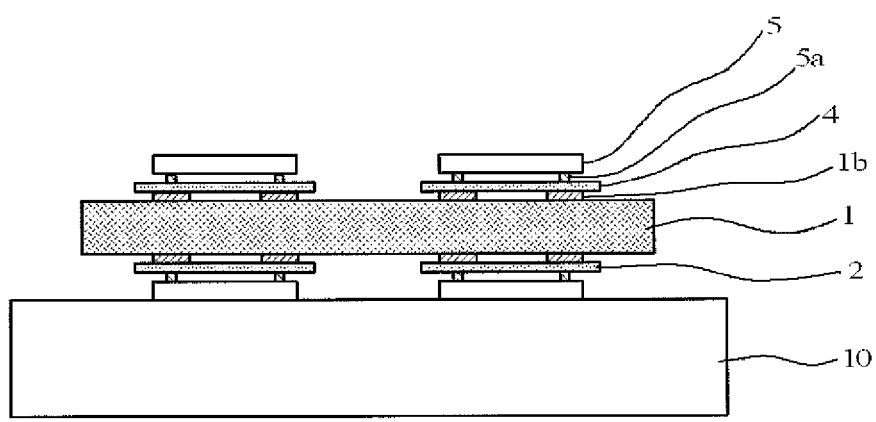
FIG. 2 is an explanatory view of a manufacturing method according to the present invention.

For the respective techniques for aligning the first adhesive film 2 with and for temporarily affixing the same onto the front surface electrode 1a, and the respective techniques for aligning the first electronic component 3 with and temporarily mounting the same onto the first adhesive film 2, it is possible to employ conventionally well-known techniques, for example, a flip chip bonder that is used to flip-chip mount the IC chip.
<Step (b)>
Next, as shown in FIG. 2, a second electronic component 5 is temporarily mounted onto the rear surface of the wiring substrate 1 with a second adhesive film 4 disposed therebetween, the second adhesive film 4 having a curing temperature lower than that of the first adhesive film 2. More specifically, on the stage 10, the second adhesive film 4 is aligned and temporarily affixed onto the rear surface electrode 1b of the wiring substrate 1, and then the second electronic component 5 having bumps 5a is aligned and temporarily mounted on top thereof.

The composition of the second adhesive film 4 is basically the same as that of the first adhesive film 2. However, it is necessary to employ one that has a curing temperature lower than the curing temperature of the first adhesive film 2. More specifically, it is preferable that the curing temperature of the first adhesive film 2 be 200 to 250° C., and the curing temperature of the second adhesive film 4 be 170 to 220° C. This allows the first adhesive film 2 and the second adhesive film 4 on both the surfaces of the wiring substrate 1 to be heated to temperatures suitable for the respective curing temperatures by heating only from the side of the first electronic component 3.

Figure 8:
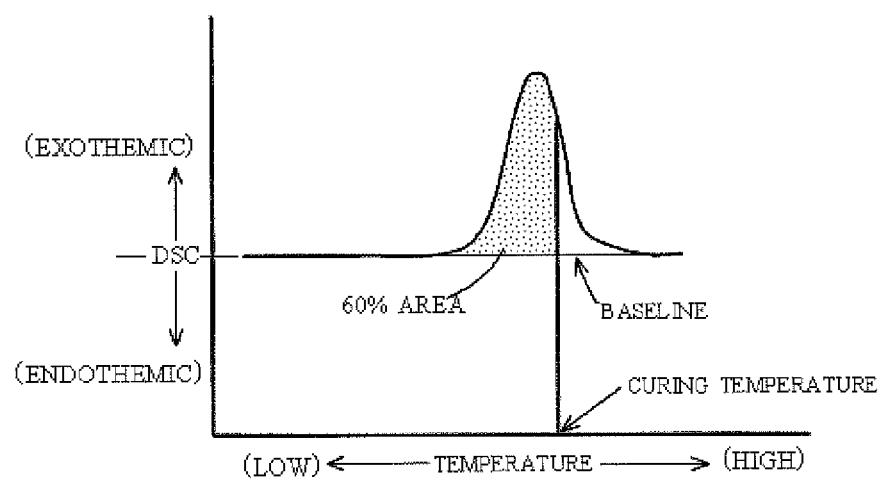
FIG. 8 is a DSC chart showing the curing temperature of an adhesive film.

Note that the curing temperatures of the first adhesive film 2 and the second adhesive film 4 can be determined on the basis of a chart obtained by differential scanning calorimetry (DSC). For example, since a peak appeared in the DSC chart while the resin was being hardened, the curing temperature was defined as the temperature at which given is 60% of the total area from the side of the low temperature on the baseline of the chart that is obtained by increasing the temperature of a sample of 5 mg from room temperature to 250° C. at a rate of 10° C./min (see FIG. 8).

The curing temperature of the adhesive film 2 or 4 can be adjusted by specifying the structure or the molecular weight of a material to be employed such as the epoxy-based resin, the film forming resin, and the hardening agent.

Note that the second electronic component 5 and the bumps 5a thereof can be constructed basically in the same manner as the first electronic component 3 and the bumps 3a thereof. On the other hand, the conventionally well-known techniques can also be employed to align and temporarily affix the second adhesive film 4 to the rear surface electrode 1b and to align and temporarily mount the second electronic component 5 onto the second adhesive film 4.

Figure 3:
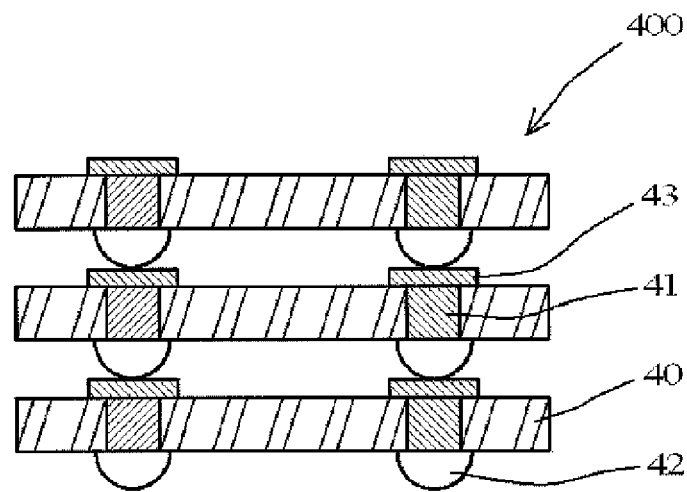
FIG. 3 is a cross-sectional view of a laminated-type electronic component.

Note that as shown in FIG. 3, at least any one of the second electronic component 5 and the first electronic component 3 described above may be an electronic component 400 with a plurality of IC chips 40, stacked one on another, which have a through electrode 41, and front bumps 42 and back bumps 43 that are connected thereto. In such a case, the through electrode 41 to be employed can be copper plated. On the other hand, the front bump 42 and the back bump 43 present between the IC chips 40 may be those that are made of gold, solder, or copper. In particular, either one or both of those bumps may preferably be formed of solder.

<Step (c)>

Figure 4:
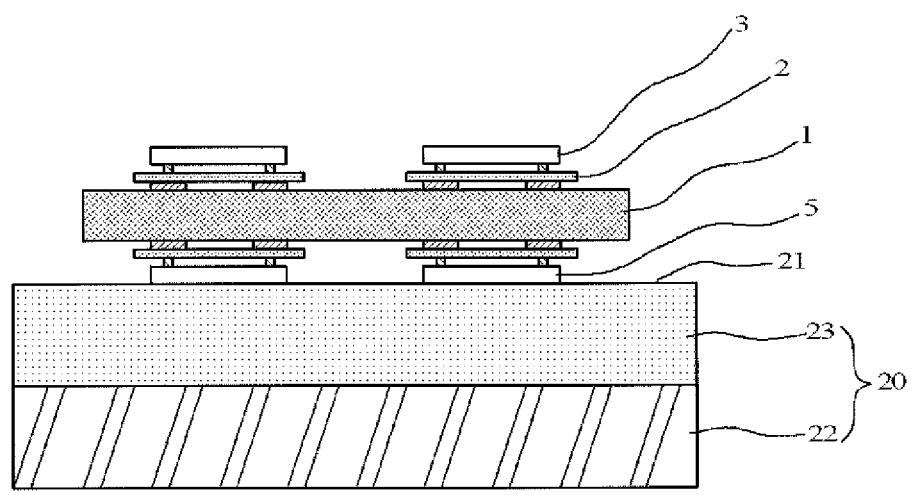
FIG. 4 is an explanatory view of a manufacturing method according to the present invention.

Next, as shown in FIG. 4, the wiring substrate 1 on which the first electronic component 3 and the second electronic component 5 are temporarily mounted is placed on a pressure bonding receiving base 20 that has a wiring substrate placement surface 21 made of an elastic material such as rubber. As such a pressure bonding receiving base 20, it is possible to employ one that is disclosed in Japanese Patent Application Laid-Open No. 2007-227622. That is, the pressure bonding receiving base 20 is made up of a receiving base body 22 made of metal or ceramic; and an elastic receiving section 23 which is disposed on the side on which an object to be pressure bonded is placed, with the front surface thereof serving as the wiring substrate placement surface 21. As used herein, the elastic material refers to an elastomer which preferably has a rubber hardness of 10 to 80.

Note that as the pressure bonding receiving base 20, the stage 10 may be used with no change made thereto. Or alternatively, although not illustrated, it is also possible to employ one which has a recess capable of receiving the second electronic component 5 and which has a wiring substrate placement surface of a relatively high rigidity.

<Step (d)>

Figure 5:
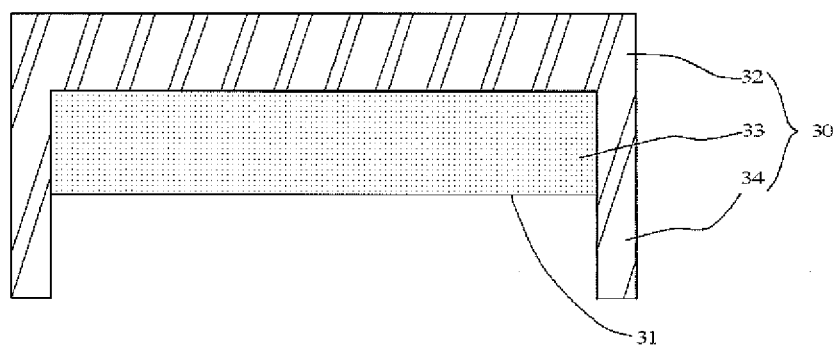
FIG. 5 is an explanatory view of a manufacturing method according to the present invention.
Figure 6:
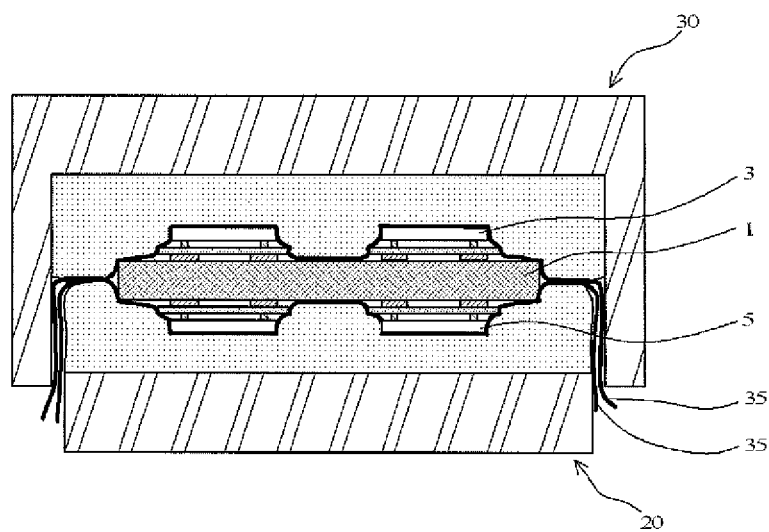
FIG. 6 is an explanatory view of a manufacturing method according to the present invention.
Figure 7:
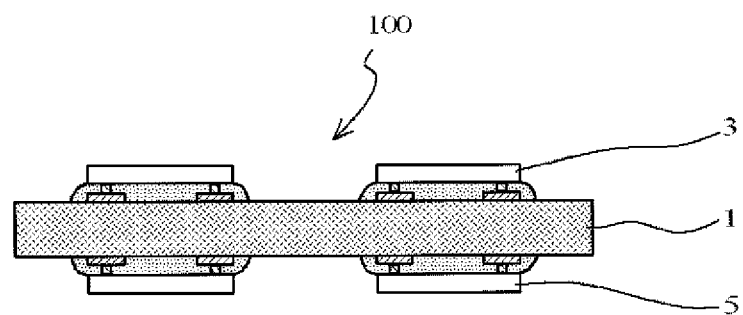
FIG. 7 is a cross-sectional view of a connection structure according to the present invention.

Finally, the first electronic component 3 is heated while being pressed against the wiring substrate 1 from the side of the first electronic component 3 with a heating and pressing tool 30 (FIG. 5) having a pressing surface 31 which is made of an elastic material such as rubber. As shown in FIG. 6, the first electronic component 3 and the second electronic component 5 are thus mounted at a time onto the respective front and rear surfaces of the wiring substrate 1. In this manner, a connection structure 100 is obtained as shown in FIG. 7.

As the heating and pressing tool 30, it is possible to employ one that is disclosed in Japanese Patent Laid-Open Publication No. 2007-227622. That is, the heating and pressing tool 30 is made up of a pressing body 32 formed of metal or ceramic; and an elastic pressing section 33 which is to be disposed on the side of an object to be pressure bonded and which has the front surface serving as the pressing surface 31. It is desirable that the pressing body 32 has sides 34 which are extended so that the pressure bonding receiving base 20 can be fitted therein. As heating means, a heater (not shown) may be provided so as to heat the pressing body 32, or alternatively, the pressing body 32 itself or the elastic pressing section 33 itself may be configured to generate heat.

In the present invention, when being heated and pressed with the heating and pressing tool 30, the first adhesive film 2 reaches, by being heated, a temperature that is higher than the temperature that the second adhesive film 4 reaches by being heated. More specifically, since the preferable curing temperature of the first adhesive film 2 is 200 to 250° C. and the preferable curing temperature of the second adhesive film 4 is 170 to 220° C., the first adhesive film 2 reaches a temperature of 200 to 250° C. by being heated, while the second adhesive film 4 reaches a temperature of 170 to 220° C. by being heated.

Note that when the first electronic component 3 is heated while being pressed against the wiring substrate 1 with the heating and pressing tool 30 from the side of the first electronic component 3, both the sides of the wiring substrate 1 on which the first electronic component 3 and the second electronic component 5 are temporarily mounted may be provided with a protective sheet 35 made of a heat-resistant resin film such as Teflon (registered trade mark) or silicone. Using the protective sheet 35 makes it possible to prevent the occurrence of dislocation of the first electronic component 3 and the second electronic component 5.

Note that as the heating and pressing tool 30, it is possible to employ one which has a recess capable of receiving the first electronic component 3 and which has a wiring substrate placement surface of a relatively high rigidity.

The connection structure of FIG. 7 which has been manufactured by the aforementioned manufacturing method according to the present invention is obtained by optimally curing at a time the ACF or NCF on the respective surfaces when the electronic components are flip-chip mounted on both the surfaces of the wiring substrate with the ACF or NCF disposed therebetween. Thus, the connection structure exhibits a good connection reliability without causing warpage on the wiring substrate.

EXAMPLES

Now, the present invention will be described more specifically with reference to Examples.

Examples 1 and 2, and Comparative Examples 1 to 4

The NCF's that exhibit the curing temperatures listed in Table 2 were prepared. Also prepared separately from them were test IC chips (6.3 mm×6.3 mm×0.2 mm in thickness) which are each provided on the periphery thereof with gold stud (which may be abbreviated as "Au stud") bumps or copper pillar/solder (which may be abbreviated as "Cu/solder") cap bumps, the bumps being 272 in number and having 85 µm bump pitches. Also prepared were glass epoxy double-sided wiring substrates (FR4 available from Hitachi Chemical Co., Ltd., 38 mm×38 mm×0.6 mm in thickness) which each have, on both the surfaces, electrode pads (Au/Ni plated Cu base) with a solder surface layer formed in a thickness of 20 µm.

These materials, the flip-chip bonder for mounting the IC's, and the elastic pressing tool (see Japanese Patent Application Laid-Open No. 2007-227622) for final pressure bonding were used to perform flip-chip mounting at a time on both the surfaces under the IC chip mounting conditions and the thermal pressure bonding conditions shown in Table 1 except for Comparative Example 1 for which the flip-chip mounting was performed on one surface. Note that listed in Table 2 are the mounting modes of Examples and Comparative Examples, the types of IC bumps (Au stud bump, Cu pillar/solder cap bump), the temperatures reached of an NCF disposed on the front surface (to be heated) and the rear surface of the wiring substrate, and the curing temperature of the NCF.

The warpage of the IC chips in the connection structures that were obtained by flip chip mounting was measured using a stylus-type surface roughness measuring instrument (SE-3H available from Kosaka Laboratory Ltd.). The results obtained are shown in Table 2. Practically, the warpage is desired to be not greater than 10 μm.

On the other hand, the conduction resistance between the IC chip and the wiring substrate in the connection structure was obtained by measuring the daisy chain resistance around the IC. The results obtained are shown in Table 2. Practically, the conduction resistance is desired to be not greater than 30Ω.

TABLE 1

| Pressure bonding | Condition | Au stud bump | Cu pillar/solder cap bump |
|---|---|---|---|
| For mounting IC chip | Load [Mpa] | 1.25 | 1.25 |
|  | Temperature - Time | 100° C. - 2 sec. | 100° C. - 2 sec. |
| For thermal pressure bonding | Load [Mpa] | 1.25 | 1.25 |
|  | Temperature - Time | 200° C. - 20 sec. (Ex. 1, Comp. Ex. 1 & 2) 230° C.-20 sec. (Comp. Ex. 3) | 250° C. - 40 sec. (Ex. 2, Comp. Ex. 4) |

TABLE 2

|  | Mounting mode | IC bump | NCF temperature reached (° C.) | | NCF curing temperature (° C.) | | IC chip Warpage (μm) | | Daisy chain resistance (Ω) | |
|---|---|---|---|---|---|---|---|---|---|---|
|  |  |  | Front surface side (to be heated) | Rear surface side | Front surface side (to be heated) | Rear surface side | Front surface side (to be heated) | Rear surface side | Front surface side (to be heated) | Rear surface side |
| Ex. 1 | Both surfaces at a time | Au stud | 200 | 170 | 200 | 170 | 1 | 1 | 20 | 20 |
| Ex. 2 | Both surfaces at a time | Cu/ solder | 250 | 220 | 250 | 220 | 1 | 1 | 20 | 20 |
| Comp. Ex. 1 | One surface | Au stud | 200 | — | 200 | — | 20 | — | — | — |
| Comp. Ex. 2 | Both surfaces at a time | Au stud | 200 | 170 | 200 | 200 | 1 | 1 | 20 | open |
| Comp. Ex. 3 | Both surfaces at a time | Au stud | 230 | 200 | 200 | 200 | 1 | 1 | open | 20 |
| Comp. Ex. 4 | Both surfaces at a time | Cu/ solder | 250 | 220 | 220 | 220 | 1 | 1 | open | 20 |

As can be seen from Table 2, the connection structures according to Examples 1 and 2 which were provided with an NCF of a higher curing temperature on the front surface (to be heated) of the wiring substrate so as to conform to the NCF temperature to be reached were found to be practically preferable with respect to the results of both the IC chip warpage and the daisy chain resistance. In contrast to this, in the case of the one-surface mounting according to Comparative Example 1, the IC chip exhibited a considerable warp. For Comparative Examples 2 to 4 in which the front and rear surfaces were provided with NCF's having the same curing temperature, the daisy chain resistance was open on the front surface or the rear surface.

INDUSTRIAL APPLICABILITY

According to the method for manufacturing a connection structure of the present invention, two types of adhesive films having different curing temperatures are used so that one adhesive film having a higher curing temperature is disposed on the front surface of a wiring substrate to be heated. This allows the adhesive films on both the surfaces of the wiring substrate to be heated at a time to the respective optimum curing temperatures. It is thus possible, without causing any warpage on the wiring substrate and the IC chips, to provide improved connection reliability for the double-sided flip-chip mounted wiring substrate for electronic components. Thus, the present invention is useful for manufacturing the connection structure by flip-chip mounting on both the surfaces of the wiring substrate.

REFERENCE SIGNS LIST 1 wiring substrate
1a front surface electrode
1b rear surface electrode
2 first adhesive film
3 first electronic component
3a bump
4 second adhesive film
5 second electronic component
5a bump 10 stage
20 pressure bonding receiving base
21 wiring substrate placement surface
22 receiving base body
23 elastic receiving section
30 heating and pressing tool
31 pressing surface
32 pressing body
33 elastic pressing section
34 side
35 protective sheet
100 connection structure
40 IC chip
41 through electrode
42 front bump
43 back bump
400 stacked-type electronic component

The invention claimed is:

1. A method of manufacturing a connection structure, the connection structure including a wiring substrate, a first electronic component flip-chip mounted on a front surface thereof, and a second electronic component flip-chip mounted on a rear surface, the method comprising the following steps (a) to (d):

Step (a)
a step of temporarily mounting the first electronic component on the front surface of the wiring substrate with a first adhesive film disposed therebetween;

Step (b)
a step of temporarily mounting the second electronic component on the rear surface of the wiring substrate with a second adhesive film disposed therebetween, the second adhesive film having a curing temperature lower than a curing temperature of the first adhesive film;

Step (c)
a step of placing, on a pressure bonding receiving base, the wiring substrate on which the first electronic component and the second electronic component are temporarily mounted; and Step (d)
a step of heating the first electronic component while pressing the first electronic component against the wiring substrate with a heating and pressing tool from the side of the first electronic component, thereby mounting simultaneously the first electronic component and the second electronic component onto the respective front and rear surfaces of the wiring substrate.

2. The manufacturing method according to claim 1, wherein the curing temperature of the first adhesive film is 200 to 250° C., and the curing temperature of the second adhesive film is 170 to 220° C.

3. The manufacturing method according to claim 1, wherein the heating and pressing tool has a pressing surface which is made of an elastic material.

4. The manufacturing method according to claim 3, wherein a pressure bonding receiving base on which the wiring substrate on which the first electronic component and the second electronic component are temporarily mounted is placed from the side of the second electronic component has a wiring substrate placement surface made of an elastic material.

5. The manufacturing method according to claim 1, wherein in the step (d), when the first electronic component is heated while being pressed against the wiring substrate with the heating and pressing tool from the side of the first electronic component, both sides of the wiring substrate on which the first electronic component and the second electronic component are temporarily mounted is provided with a protective sheet for pressing.

6. The manufacturing method according to claim 1, wherein at least any one of the first electronic component and the second electronic component is an IC chip.

7. The manufacturing method according to claim 1, wherein at least any one of the first electronic component and the second electronic component is an electronic component with a plurality of IC chips stacked one on another, the electronic component having a through electrode and a front bump and a back bump that are connected thereto, and at least any one of the front bump and the back bump present between the IC chips is made of a solder.

8. A connection structure manufactured by the manufacturing method according to claim 1.

9. A method of manufacturing a connection structure, the connection structure including a wiring substrate, a first electronic component flip-chip mounted on a front surface thereof, and a second electronic component flip-chip mounted on a rear surface, the method comprising the following steps (a) to (d):

Step (a)
a step of temporarily mounting the first electronic component on the front surface of the wiring substrate with a first adhesive film disposed therebetween;

Step (b)
a step of temporarily mounting the second electronic component on the rear surface of the wiring substrate with a second adhesive film disposed therebetween, the second adhesive film having a curing temperature lower than a curing temperature of the first adhesive film;

Step (c)
a step of placing, on a pressure bonding receiving base, the wiring substrate on which the first electronic component and the second electronic component are temporarily mounted; and Step (d)
a step of heating the first electronic component while pressing the first electronic component against the wiring substrate with a heating and pressing tool from the side of the first electronic component, thereby mounting simultaneously the first electronic component and the second electronic component onto the respective front and rear surfaces of the wiring substrate, wherein, when the first electronic component is heated and pressed with the heating and pressing tool in the step (d), the first adhesive film reaches, by being heated, a temperature that is higher than a temperature that the second adhesive film reaches by being heated.

* * * * *